United States Patent [19]
Naji et al.

[11] Patent Number: 5,986,925
[45] Date of Patent: Nov. 16, 1999

[54] MAGNETORESISTIVE RANDOM ACCESS MEMORY DEVICE PROVIDING SIMULTANEOUS READING OF TWO CELLS AND OPERATING METHOD

[75] Inventors: Peter K. Naji, Phoenix; Russell G. Byrd, Mesa, both of Ariz.

[73] Assignee: Motorola, Inc., Schaumburg, Ill.

[21] Appl. No.: 09/055,731

[22] Filed: Apr. 7, 1998

[51] Int. Cl.$^6$ ................................................. G11C 11/00
[52] U.S. Cl. ........................................... 365/158; 365/171
[58] Field of Search ..................................... 365/158, 171

[56] References Cited

U.S. PATENT DOCUMENTS 5,699,293 12/1997 Tehrani et al. ......................... 365/158
5,734,605 3/1998 Zhu et al. ............................... 365/173
5,748,519 5/1998 Tehrani et al. ........................... 365/98

Primary Examiner—David Nelms
Assistant Examiner—Hoai V. Ho
Attorney, Agent, or Firm—Euguene A. Parsons; William E. Koch

[57] ABSTRACT

A magnetoresistive random access memory (MRAM) having a novel circuit configuration (40) is provided. The MRAM device includes a plurality of magnetic memory cells in a memory array (41). The magnetic memory cell includes magnetoresistive layers separated by an insulating layer which forms a tunneling junction between the magnetoresistive layers. A sense line selector (42, 43) selects two memory cells (48) in which a sense current (66) is applied from a current source (45). Voltages generated over the memory cells are sensed and compared to predetermined threshold voltages to provide outputs (OUT1, OUT2) which correspond to states stored in the pair of the memory cells (48). This new MRAM device attains non-volatile random access memory with high-speed and high-density.

13 Claims, 4 Drawing Sheets

MAGNETORESISTIVE RANDOM ACCESS MEMORY DEVICE PROVIDING SIMULTANEOUS READING OF TWO CELLS AND OPERATING METHOD

FIELD OF THE INVENTION

The present invention relates to a magnetoresistive random access memory device having a plurality of magnetic memory cells and an operating method thereof, and more particularly, to a device which selects a pair of memory cells and senses states contained in the pair of memory cells.

BACKGROUND OF THE INVENTION

A magnetoresistive random access memory device (MRAM), which is one of non-volatile memory devices, includes a plurality of magnetic memory cells employing the giant magnetoresistive (GMR) effect. It is known that the GMR effect appears in multi-layer films which are alternately stacked by magnetic layers and non-magnetic layers. Magnetic resistance over a magnetic memory cell indicates minimum and maximum values when magnetic vectors in magnetic layers point in a same direction and in an opposite direction, respectively. The same and opposite directions of magnetic vectors are called "Parallel" and "Antiparallel," respectively. When GMR material is employed for a memory device, parallel and antiparallel directions, for example, are logically defined as a "0" state and a "1" state, respectively.

The MRAM device normally arranges magnetic memory cells on intersections of word and sense lines. The MRAM circuit, for example, is described in U.S. Pat. No. 5,699,293 entitled "A METHOD OF OPERATING A RANDOM ACCESS MEMORY DEVICE HAVING A PLURALITY OF PAIRS OF MEMORY CELLS AND THE MEMORY DEVICE", issued Dec. 16, 1997 assigned to the same assignee.

Activation of a word line and a sense line enables read and write states in the memory cell. The sense line is directly coupled to the memory cells in series and a sense current flows in the magnetic layers so that a sense current is affected by magnetic vectors in the magnetic layers and the current value is alternated according to the direction of magnetic vectors. Sensing the changes in the sense current value allows one to detect states stored in the memory cells. On the other hand, a writing process is carried out by applying a sufficient magnetic field to switch magnetic vectors in the magnetic layers. The word and sense currents both create a total magnetic field and apply it to the memory cell which stores states in the memory cell in accordance with directions of the word current.

The prior magnetic memory device reads and writes a single bit in a memory cell after activating a word line and a sense line. As a processor improves its speed, a memory device is also needed for high speed operation. To increase the operating speed, the applicant proposed the method of sequentially selecting a word line in U.S. Pat. No. 5,748,519 entitled "A METHOD OF SELECTING A MEMORY CELL IN A MAGNETIC RANDOM ACCESS MEMORY DEVICE", issued May 5, 1998 assigned to the same assignee and incorporated by reference herein. This invention teaches to sequentially select a word line after activating a sense line so that it saves time for the sense line selection and improves the cycle time. However it still handles a single bit information for reading and writing operations.

Accordingly, it is a purpose of the present invention to provide an improved non-volatile MRAM device having a high-speed operation.

It is another purpose of the present invention to provide an improved non-volatile MRAM device having a high density memory cell arrangement.

SUMMARY OF THE INVENTION

These needs and others are substantially met through provision of a magnetoresistive random access memory (MRAM) device which includes a memory array having a plurality of pairs of memory cells. Each memory cell includes magnetic layers separated by an insulated layer which makes a tunneling junction between the magnetic layers. A selector activates a pair of memory cells in the memory array and allows a current source to provide a sense current through the pair of memory cells. The sense current generates voltages over the memory cells. An output circuit introduces the voltages to evaluate and provide four states which may be stored in the pair of memory cells.

DETAILED DESCRIPTION OF THE PREFERRED EMBODIMENT

Figure 1:
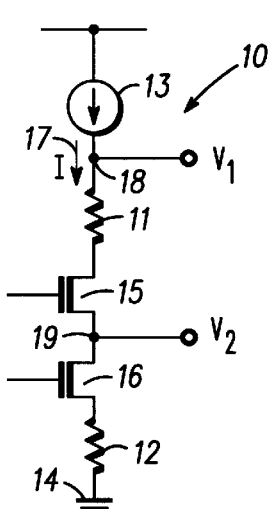
FIG. 1 shows a simplified circuit configuration for describing a basic concept according to the present invention.

FIG. 1 shows a simplified circuit configuration 10 for describing a basic concept of the present invention. A pair of magnetoresistive random access memory cells 11 and 12 are coupled between a current source 13 and a ground or common terminal 14. The pair of memory cells 11 and 12 are activated by turning transistors 15 and 16 on, which allows current source 13 to provide a sense current 17 through memory cells 11 and 12 to common terminal 14. Sense current 17 generates voltages V1 and V2 at nodes 18 and 19, respectively, which vary in accordance with magnetic resistance over memory cells 11 and 12.

Assuming that current source 13 supplies a constant current I, memory cells 11 and 12 have magnetic resistance of R on a Parallel state and of $R+\Delta R$ in an Antiparallel state, and transistors 15 and 16 have a turn-on resistance Ron. When memory cells 11 and 12 both are in the Parallel state, then voltages V1 and V2 are given by the following equations (1) and (2).

$$V1 = 2(R+Ron) \cdot I \quad (1)$$

$$V2 = (R+Ron) \cdot I \quad (2)$$

If memory cell 11 has the Antiparallel state and memory cell 12 has the Parallel state, then voltages V1 and V2 are obtained as the following equations (3) and (4).

$$V1 = (2R + \Delta R + 2Ron) \cdot I \quad (3)$$

$$V2 = (R + Ron) \cdot I \quad (4)$$

Next, if memory cell 11 has the Parallel state and memory cell 12 has the Antiparallel state, then voltages V1 and V2 are provided by the following equations (5) and (6).

$$V1 = (2R + \Delta R + 2Ron) \cdot I \quad (5)$$

$$V2 = (R + \Delta R + Ron) \cdot I \quad (6)$$

Further, when memory cells 11 and 12 both have the Antiparallel state, then voltages V1 and V2 will be the following equations (7) and (8).

$$V1 = 2(R + \Delta R + Ron) \cdot I \quad (7)$$

$$V2 = (R + \Delta R + Ron) \cdot I \quad (8)$$

Summing up the above equations (1)–(8), the following table 1 is given assuming that Ron is nearly equal to zero for simplicity, wherein "0" and "1" in columns for cells 11 and 12 mean the Parallel and Antiparallel states, respectively.

TABLE 1

| cell 11 | cell 12 | V1 | V2 |
|---|---|---|---|
| 0 | 0 | $2R \cdot I$ | $R \cdot I$ |
| 1 | 0 | $(2R + \Delta R) \cdot I$ | $R \cdot I$ |
| 0 | 1 | $(2R + \Delta R) \cdot I$ | $(R + \Delta R) \cdot I$ |
| 1 | 1 | $2(R + \Delta R) \cdot I$ | $(R + \Delta R) \cdot I$ |

Figure 2:
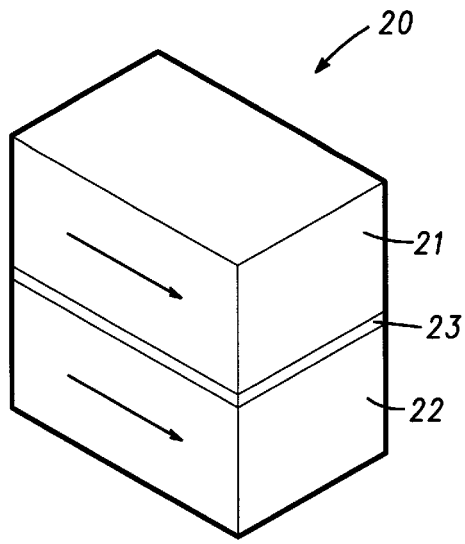
FIG. 2 is an isometric view of a simplified and enlarged memory cell structure.
Figure 3:
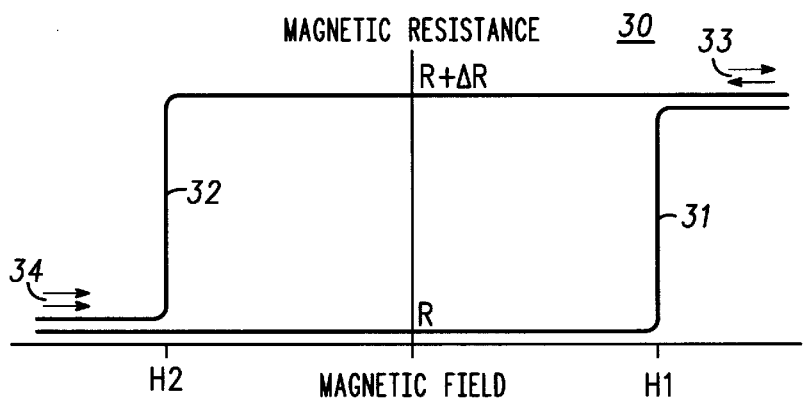
FIG. 3 shows a graph illustrating characteristics of the memory cell shown in FIG. 2.

FIGS. 2 and 3 show an isometric view of a simplified and enlarged memory cell structure 20 and hysteresis characteristics 30 of memory cell 20 in FIG. 2. It should be noted that other types of magnetic memory cells can be employed for the memory device. Memory cell 20 has three layers which include first and second magnetic layers 21 and 22 separated by an insulating or barrier layer 23. First and second magnetic layers 21 and 22 use magnetic material such as CoFe and NiFeCo, respectively. Magnetic vectors in first magnetic layer 21, for example, are magnetically pinned by an antiferromagnetic layer (not shown) which is placed adjacent layer 21. Second magnetic layer 22, which is magnetically free, alternates magnetic vectors responding to an external magnetic field. Barrier layer 23 is formed by an insulating material such as $Al_2O_3$ and has a thickness of around 30 Angstrom. The thin thickness allows barrier layer 23 to form a tunneling junction between first and second magnetic layers 21 and 22, through which a tunneling current flows. As will be seen in FIG. 3, a magnetic resistance over the memory cell changes according to directions of magnetization in second magnetic layer 22 which causes a tunneling current in barrier layer 23 to vary.

Referring to FIG. 3 again, the abscissa of FIG. 3 indicates a direction and strength of a magnetic field applied to memory cell 20. The ordinate represents the magnetic resistance over the memory cell 20. Assuming memory cell 20 is in the state that magnetic vectors in layers 21 and 22 point in the Parallel (same direction) under no external magnetic field, the external magnetic field changes to a value H1 moving to the right along the abscissa. As shown by curve 31, magnetic vectors in second magnetic (free) layer 22 are switched to the left at a magnetic field H1 and magnetic vectors in layers 21 and 22 are oriented in the Antiparallel (opposite direction) as indicated by arrows 33. Consequently, a magnetic resistance over memory cell 20 increases from R by $\Delta R$. Next changing the magnetic field from H1 as shown by curve 32, magnetic vectors in second magnetic layer 22 are switched at a magnetic field H2 to the right. Consequently the magnetic resistance is lowered to R by $\Delta R$ and magnetic vectors in layers 21 and 22 point in the Parallel as indicated by arrows 34.

As described above, the magnetic resistance over memory cell 20 depends on directions of magnetization in magnetic layer 22. Assuming a constant current I is applied to memory cell 20, when memory cell 20 has magnetic vectors pointing in the Parallel, the voltage generated over memory cell 20 indicates $R \cdot I$. Further, when magnetic vectors point in the Antiparallel, the voltage reaches to $(R + \Delta R) \cdot I$.

Figure 5:
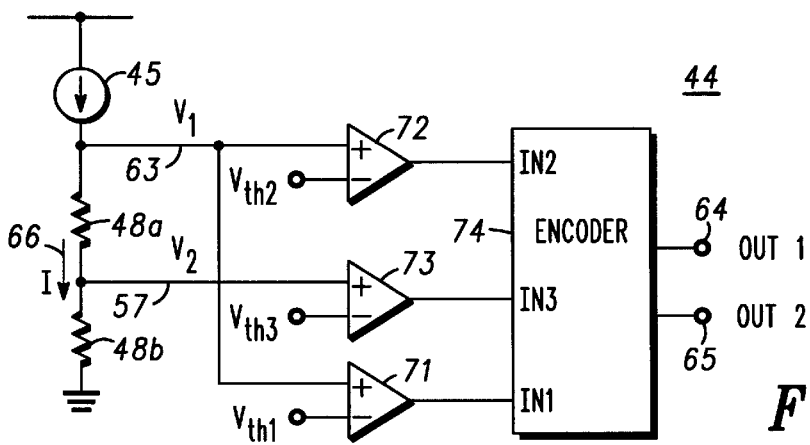
FIG. 5 shows one embodiment of an output circuit shown in FIG. 4.
Figure 4:
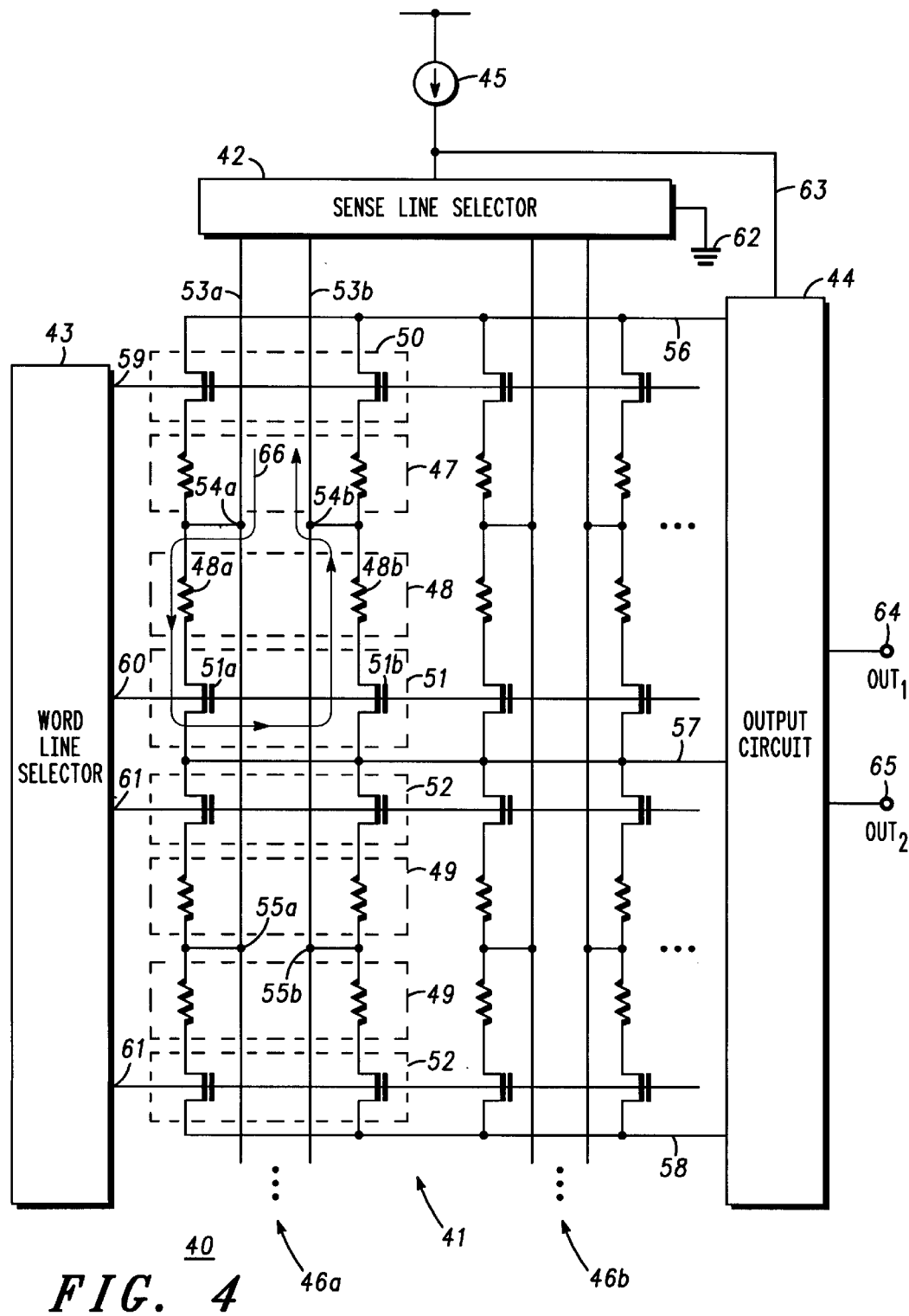
FIG. 4 shows a detailed MRAM device circuit according to the present invention.

Referring to FIG. 4, a detailed MRAM device circuit 40 is illustrated. MRAM device circuit 40 includes a memory array 41, a sense line selector 42, a word line selector 43, an output circuit 44, and a current source 45. Memory array 41 includes and arranges a plurality of memory banks 46a and 46b in parallel. Each memory bank has pairs of memory cells 47–49, and pairs of transistors 50–52 which are coupled to the pairs of memory cells 47–49 in series to activate one of pairs of memory cells. Memory bank 46a, for example, has a pair of sense lines 53a and 53b which are coupled to sense line selector 42 and pairs of memory cells 47–49 via nodes 54a and 54b, and nodes 55a and 55b. Memory cells 47–49, further, are coupled to pairs of transistors 50–52 in series which are connected to tap lines 56–58. Select lines 59–61 are coupled to gate electrodes of pairs of transistors 50–52 to select one of pairs of memory cells 47–49. Sense line selector 42 selects a pair of sense lines 53a and 53b, for example, and couples sense lines 53a to current source 45 and another sense line 53b to a ground or common terminal 62, thereby a sense current from current source 45 flows through sense lines 53a and 53b to common terminal 62. Word line selector 43 provides a selecting signal on one of select lines 59–61 which turns on one of pairs of transistors 50–52. Output circuit 44, the detail circuit of which is depicted in FIG. 5, receives voltages on tap lines 56–58 and a data line 63. The voltages are compared to predetermined threshold voltages to provide output OUT1 and OUT2 on output terminals 64 and 65.

Next, the read operation for a pair of memory cells 48, for instance, is described in detail with reference to FIG. 4. First of all, sense line selector 42 connects sense line 53a to current source 45 and sense line 53b to common terminal 62, thereby memory bank 46a is activated. Then, word line selector 43 sends a selecting signal on select line 66 to turn transistors 51a and 51b on. Consequently, the same circuit as shown in FIG. 1 is formed in memory bank 46a, which allows a sense current I indicated by an arrow 66 to flow from current source 45 through bank selector 42, sense line 53a, node 54a, memory cell 48a, transistor 51a, tap line 57, transistor 51b, memory cell 48b, node 54b, and sense line 53b, to common terminal 62. Sense current 66 generates first and second voltages on node 54 connected to data line 63 and tap line 57 which correspond to voltages V1 and V2 in FIG. 1, respectively. Therefore, memory states stored in memory cells 48a and 48b are produced by output voltages on data line 63 and tap line 57 in accordance with TABLE 1.

FIG. 5 shows one embodiment of output circuit 44 for providing states stored in a pair of memory cells 48a and 48b. The pair of memory cells 48a and 48b, which is selected by sense line selector 42 and word line selector 43, is coupled to output circuit 44 through data line 63 and tap line 57. Memory cells 48a and 48b are connected to current source 45 in series. Data line 63 is connected to non-inverse inputs of voltage comparators 71 and 72 which compares voltage V1 on data line 63 to first and second threshold voltages Vth1 and Vth2 given on inverse inputs of comparators 71 and 72, respectively. Tap line 57 is connected to a non-inverse input of voltage comparator 73 to compare voltage V2 on tap line 57 to third threshold voltage Vth3 which is given on an inverse input of comparator 73. Output signals from comparators 71–73 are conveyed to encoder 74 to provide output data OUT1/OUT2 at output terminals 64 and 65.

Threshold voltages Vth1–Vth3 are chosen as follows. As can be seen in TABLE 1, voltage V1 has three different levels, 2R·I, (2R+ΔR)·I, and 2(R+ΔR)·I, and voltage V2 has two different levels, R·I and (R+ΔR). Therefore, two different threshold voltages Vth1 and Vth2 are employed to distinguish three levels of first voltage V1 and one threshold voltage Vth3 is used to differentiate two levels of second voltage V2. These threshold voltages Vth1, Vth2, and Vth3 are defined according to the following relations (9), (10), and (11).

$$2R \cdot I < Vth1 < (2R+\Delta R) \cdot I \quad (9)$$

$$(2R+\Delta R) \cdot I < Vth2 < 2(R+\Delta R) \cdot I \quad (10)$$

$$R \cdot I < Vth3 < (R+\Delta R) \quad (11)$$

Typically, these threshold voltages Vth1, Vth2, and Vth3 are set up to $(2R+\Delta R/2) \cdot I$ for Vth1, $(2R+3/2 \cdot \Delta R) \cdot I$ for Vth2, and $(R+\Delta R/2) \cdot I$ for Vth3, respectively.

TABLE 2 shows a relationship between states in a couple of cells and outputs from the output circuit. Sense line selector 42 and word line selector 43 designate cells 11 and 12 where bit information is stored. When both cells 11 and 12 contain bit 0, for example, voltage V1 which is equal to 2R·I (see TABLE 1) is appeared on data line 63. Voltage V1 is compared to threshold voltages Vth1 and Vth2 at comparators 71 and 72 which provide a "0" state to inputs IN1 and IN2 of encoder 74 because voltage V1 is lower than threshold voltages Vth1 and Vth2. At the same time, voltage V2 equal to R·I on tap line 57 also is compared to threshold voltage Vth3 at comparator 73 which gives a "0" state to input IN3. All "0" states received at IN1–IN3 are encoded at encoder 74 which supplies "0/0" on output terminals OUT1 and OUT2. For other states in cells 11 and 12 the same encoding process is carried out as shown on TABLE 2.

TABLE 2

| cell 11 | cell 12 | IN1 | IN2 | IN3 | OUT1/OUT2 |
|---------|---------|-----|-----|-----|-----------|
| 0 | 0 | 0 | 0 | 0 | 0/0 |
| 1 | 0 | 1 | 0 | 0 | 1/0 |
| 0 | 1 | 1 | 0 | 1 | 0/1 |
| 1 | 1 | 1 | 1 | 1 | 1/1 |

Figure 6:
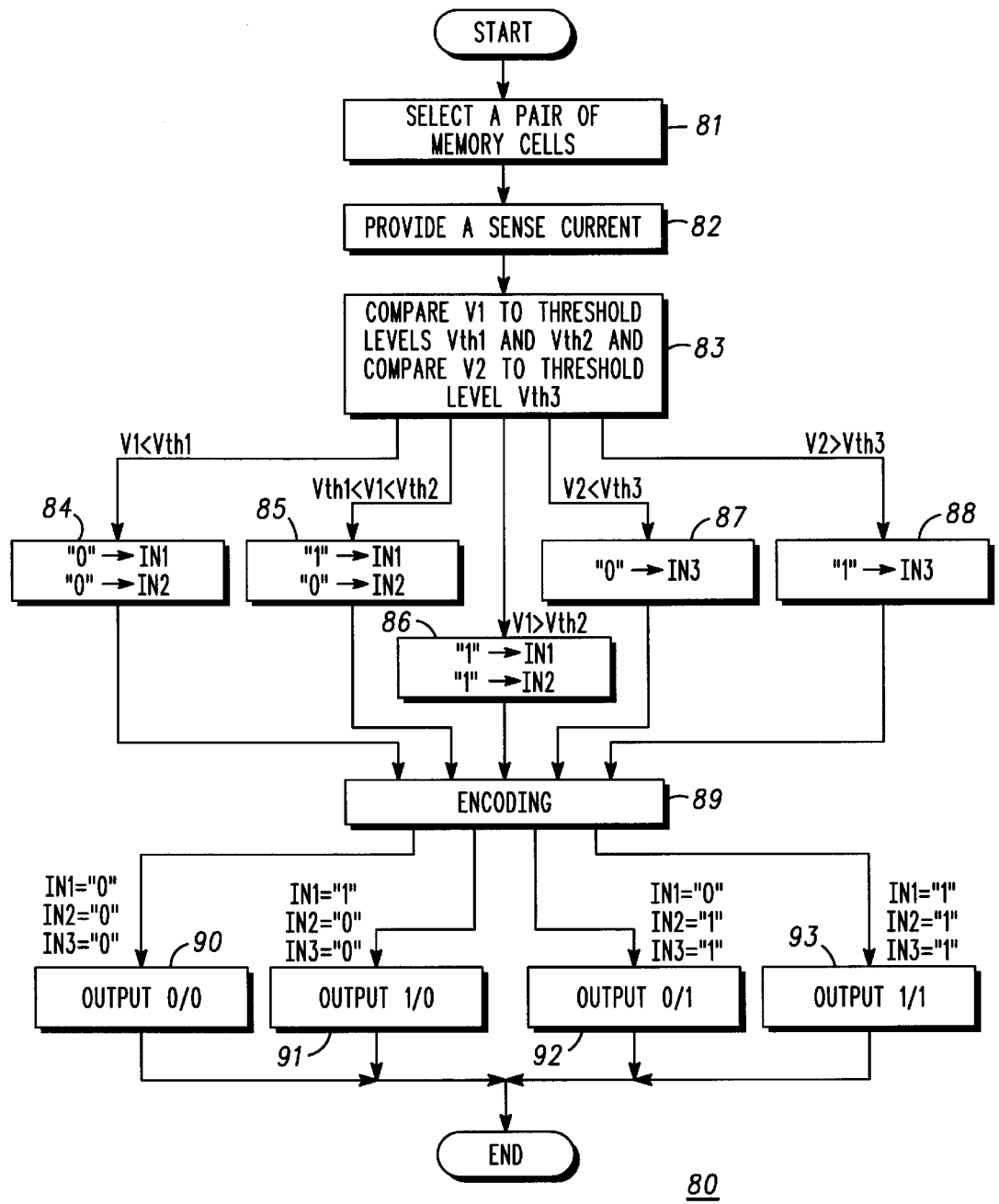
FIG. 6 shows a flowchart illustrating steps for sensing states stored in a pair of memory cells.

FIG. 6 shows a flowchart 80 illustrating steps for sensing states stored in a pair of memory cells. First of all, at block 81, a pair of memory cells is selected by sense line selector 42 and word line selector 43 (FIG. 4). Memory cells 48a and 48b, for instance, are selected by activation of sense lines 53a and 53b and select line 60. Next, going to block 82, current source 45 provides a sense current to the pair of memory cells 48a and 48b (FIG. 5), thereby drop voltages are created over memory cells 48a and 48b, respectively. At block 83, first and second voltages V1 and V2 are applied to output circuit 44 to evaluate states in memory cells 48a and 48b. First voltage V1 is compared to threshold voltages Vth1 and Vth2 by comparators 71 and 72 and second voltage is compared to threshold voltage Vth3 by comparator 73.

When first voltage V1 is lower than threshold voltages Vth1 and Vth2, then going to block 84, comparators 71 and 72 provide a "0" state to input IN1 and IN2 of encoder 74, respectively. When first voltage V1 stays between threshold voltages Vth1 and Vth2, at block 85 input IN1 and IN2 receive "1" and "0" states, respectively. If first voltage V1 is higher than threshold voltages Vth1 and Vth2, then at block 86 a "1" state is given to inputs IN1 and IN2. Next, second voltage V2 is compared to threshold voltage Vth3. When second voltage V2 is lower than threshold voltage Vth3, then the process moves to block 87 and comparator 73 sends a "0" state to input IN3 of encoder 74. If second voltage V2 is higher than threshold voltage Vth3, a "1" state is supplied to input IN3 at block 88.

Encoder 74 encodes the states applied at inputs IN1–IN3 to provide encoded data (0/0, 0/1, 1/0, and 1/1) on output terminals OUT1 and OUT2 (blocks 90–93).

Figure 7:
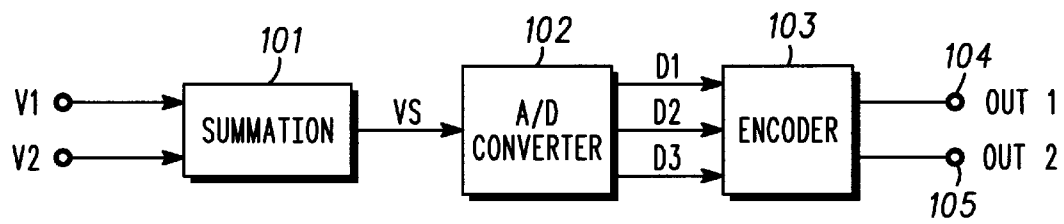
FIG. 7 shows another embodiment of an output circuit.

FIG. 7 shows another embodiment of output circuit 44. Output circuit 44 receives voltages V1 and V2 which are generated over a pair of cell 48a and 48b, for example. Voltages V1 and V2 are summed up by a summation circuit (summer) 101 to produce a summation voltage Vs which is converted into digital signals D1–D3 by an analog to digital (A/D) converter 102. An encoder 103 encodes digital signals D1–D3 to output data OUT1/OUT2 on output terminals 104 and 105.

Figure 8:
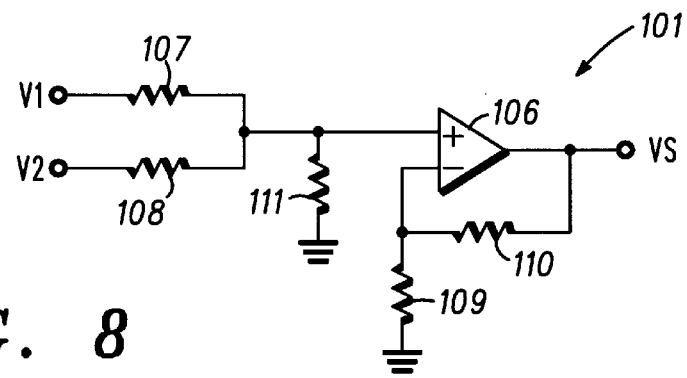
FIG. 8 shows a circuit of a summation circuit in the output circuit.

Summer 101 is shown in FIG. 8, for example. This circuit is well known as a non-inverting summing amplifier. Voltages V1 and V2 are connected through resistors 107 and 108 to amplifier 106. Resistors 109 and 110 set up a gain of amplifier 106 and resistor 111 gives a bias voltage for amplifier 106.

Figure 9:
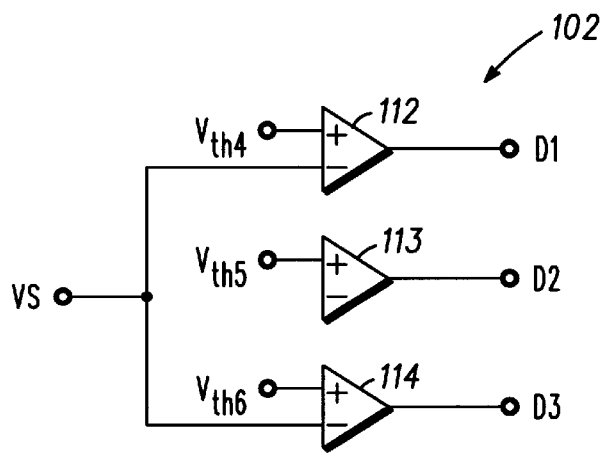
FIG. 9 shows a detailed circuit of an A/D circuit in the output circuit.

FIG. 9 gives an example of A/D converter 102 which converts an analog voltage into digital form. Comparators 112–114 receive voltage Vs which is compared with threshold voltages Vth4–Vth6 to provide digital signals D1–D3, respectively. Threshold voltages Vth4–Vth6 are set up as follows.

Assuming that voltages V1 and V2 shown in TABLE 1 are applied to summer 101 and amplifier 106 has a gain 1, summation voltage Vs is given as Vs of TABLE 3. When cells 11 and 12 contain "1" and "0", for instance, voltages V1 and V2 indicate (2R+ΔR) and R·I, respectively. Accordingly, summer 101 provides (3R+ΔR)·I as the summation voltage.

TABLE 3

| cell 11 | cell 12 | Vs | D1 | D2 | D3 | OUT1/OUT2 |
|---------|---------|-----|----|----|----|-----------|
| 0 | 0 | 3R · I | 0 | 0 | 0 | 0/0 |
| 1 | 0 | (3R + ΔR) · I | 1 | 0 | 0 | 1/0 |
| 0 | 1 | (3R + 2ΔR) · I | 1 | 1 | 0 | 0/1 |
| 1 | 1 | (3R + 3ΔR) · I | 1 | 1 | 1 | 1/1 |

In order to discriminate the states stored in a pair of the cells, the following equations (12)–(14) give typical threshold voltages Vth4–Vth6 which place at midpoints between summation voltages.

$$Vth4 = (3R+\Delta R/2) \cdot I \quad (12)$$

$$Vth5 = (3R+3/2 \cdot \Delta R) \cdot I \quad (13)$$

$$Vth6 = (3R+5/2 \cdot \Delta R) \cdot I \quad (14)$$

Summation voltage Vs is compared with the above threshold voltage Vth4–Vth6 by comparators 112–114 to provide digital signals D1–D3 as shown in TABLE 3. Digital signals D1–D3 are conveyed to encoder 103 which encodes signals D1–D3 to encoded data OUT1/OUT2.

Thus, it should be appreciated that a novel MRAM device has a plurality of pairs of magnetic memory cells and provides bit information stored in a pair of magnetic memory cell designated by selectors. The MRAM device is capable of reducing a reading operation time and increasing a cell arrangement efficiency.

What is claimed is:

1. A magnetic random access memory device comprising:
    a memory array including a plurality of memory cells, each of the memory cells having magnetoresistive layers separated by an insulating layer;
    a sense line selector for selecting two memory cells in the memory array;
    a current source for simultaneously providing a sense current to the two memory cells; and
    an output circuit for sensing two voltages to provide an output indicating states stored in the two memory cells.

2. The magnetic random access memory device as claimed in claim 1 wherein the memory array comprises a plurality of memory banks, each of the memory banks including a plurality of pairs of memory cells.

3. The magnetic random access memory device as claimed in claim 2 wherein each of the memory banks further includes a plurality of transistors, two of the transistors being coupled to the two memory cells in series.

4. The magnetic random access memory device as claimed in claim 1 wherein the memory selector comprises:
    a sense line selector for selecting first and second sense lines; and
    a word line selector for selecting a row of memory cells, so that the current source, the two memory cells and the first and second sense lines are coupled in series for providing the sense current.

5. The magnetic random access memory device as claimed in claim 4 wherein the sense line selector couples the first sense line to the current source and the second sense line to a common line.

6. The magnetic random access memory device as claimed in claim 1 wherein the output circuit comprises:
    a comparator for comparing first and second voltages to predetermined threshold voltages to provide digital signals, the first voltage being generated over one memory cell in the two memory cells and the second voltage being generated across both of the two memory cells; and
    an encoder for encoding the digital signals to encoded data according to a predetermined procedure.

7. The magnetic random access memory device as claimed in claim 1 wherein the output circuit comprises:
    a summation circuit for summing first and second voltages generated across the memory cells to produce a summation voltage, the first voltage being generated across one of the two memory cells and the second voltage being generated across both of the two memory cells;
    a converter for converting the summation voltage to digital signals; and
    an encoder for encoding the digital signals to encoded data according to a predetermined procedure.

8. The magnetic random access memory device as claimed in claim 1 wherein the memory cell forms a tunneling junction between magnetoresistive layers.

9. A magnetic random access memory device comprising:
    a memory array including a plurality of memory cells forming rows and columns, each of the memory cells having magnetoresistive layers separated by an insulating layer which forms a tunneling junction between the magnetoresistive layers;
    a word line selector for selecting a row of memory cells in the memory array;
    a current source for providing a sense current to two memory cells;
    a sense line selector for selecting two sense lines and coupling one end of the sense line to the current source and another end of the sense line to a common line; and
    an output circuit for sensing two voltages to provide an output indicating states stored in the two memory cells.

10. The magnetic random access memory device as claimed in claim 9 wherein the output circuit comprises:
    a comparator for comparing first and second voltages to predetermined threshold voltages to provide digital signals, the first voltage being generated across one of the two memory cells and the second voltage being generated across both of the two memory cells; and
    an encoder for encoding the digital signals to encoded data according to a predetermined procedure.

11. The magnetic random access memory device as claimed in claim 9 wherein the output circuit comprises:
    a summation circuit for summing first and second voltages generated across the memory cells to produce a summation voltage, the first voltage being generated across one of the two memory cells and the second voltage being generated across both of the two memory cells;
    a converter for converting the summation voltage to digital signals; and
    an encoder for encoding the digital signals to encoded data according to a predetermined procedure.

12. A method of sensing states stored in two memory cells arranged in a memory array, each of the memory cells having magnetoresistive layers separated by an insulating layer which forms a tunneling junction between the magnetoresistive layers, the method comprising the steps of:
    selecting the two memory cells;
    providing a sense current from a current source to the two memory cells; and
    comparing voltages generated across the memory cells with predetermined threshold voltages to provide an output indicating states stored in the pair of memory cells.

13. The method as claimed in claim 12 wherein the step of comparing voltages generated over the memory cells with predetermined threshold voltages comprising the steps of:
    comparing first and second voltages with predetermined threshold voltages to provide digital signals, the first voltage being generated across one of the two memory cells and the second voltage being generated across both of the two memory cells; and
    encoding the digital signals to encoded data.

* * * * *

UNITED STATES PATENT AND TRADEMARK OFFICE
CERTIFICATE OF CORRECTION

PATENT NO. : 5,986,925
DATED : November 16, 1999
INVENTOR(S) : Naji et al.

It is certified that error appears in the above-identified patent and that said Letters Patent is hereby corrected as shown below:

<u>Column 1,</u>
Line 5, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*